United States Patent [19]
Verma

[11] Patent Number: 4,717,687
[45] Date of Patent: Jan. 5, 1988

[54] METHOD FOR PROVIDING BURIED LAYER DELINEATION

[75] Inventor: Jaipal S. Verma, Tempe, Ariz.

[73] Assignee: Motorola Inc., Schaumburg, Ill.

[21] Appl. No.: 878,931

[22] Filed: Jun. 26, 1986

[51] Int. Cl.$^4$ .................... H01L 21/383; H01L 21/425
[52] U.S. Cl. ........................................ 437/97; 437/26; 437/985
[58] Field of Search ............... 148/186, 1.5, 187, 1.75; 29/576 B; 437/97

[56] References Cited

U.S. PATENT DOCUMENTS

| | | | |
|---|---|---|---|
| 4,149,915 | 4/1979 | Bohg et al. | 148/1.5 X |
| 4,151,010 | 4/1979 | Goth | 148/1.5 |
| 4,381,956 | 5/1983 | Lane | 29/576 E |
| 4,389,255 | 6/1983 | Chen et al. | 148/187 X |
| 4,601,098 | 7/1986 | Oda | 148/187 X |
| 4,677,739 | 7/1987 | Doering et al. | 29/571 X |

Primary Examiner—George T. Ozaki
Attorney, Agent, or Firm—Joe E. Barbee

[57] ABSTRACT

A simplified process is used to obtain pattern delineation for a buried layer by making use of the metastable state of silicon to grow oxide at different rates on the surface of the silicon. A silicon substrate having dopants implanted in a predetermined location is annealed at a low temperature. Oxide is then grown on the surface of the substrate at a temperature which maintains the silicon in a metastable state. The oxide will grow faster over the doped region than it will over the undoped region thereby providing a step which can be used for pattern delineation. After the oxide is grown the substrate is diffused in order to drive the impurity to the desired depth.

5 Claims, 8 Drawing Figures

METHOD FOR PROVIDING BURIED LAYER DELINEATION

BACKGROUND OF THE INVENTION

This invention relates, in general, to the manufacture of semiconductor integrated circuits, and more particularly, to the manufacture of a semiconductor device having a pattern delineation on its surface.

In the manufacture of integrated circuits, particularly bipolar integrated circuits, it is common to form a localized buried layer prior to the growing of an epitaxial layer. The buried layer is typically used as a collector in a bipolar integrated circuit. The buried layer is conventionally formed by a diffusion or by an ion implantation process. Ion implantation tends to damage the surface of the substrate thereby requiring annealing to repair such damage.

In the manufacture of these devices the buried layer is formed as an enhanced doped region in the surface of a semiconductor substrate. After this formation, an epitaxial layer is grown over the substrate which also covers the buried layer. During subsequent processing of the integrated circuit it is important to know the exact location of the buried layer so that other required elements of the integrated circuit can be formed in proper relationship. A common method practiced to delineate the location of the buried layer is to indent the region containing the buried layer. This is typically done by etching the region containing the buried layer prior to the growth of the epitaxial layer. In order to do this the surface of the semiconductor substrate must be protected in order to prevent simultaneously etching the surface of the substrate. One method which is disclosed in U.S. Pat. No. 4,389,255 which issued to Chen et al. on June 21, 1983, is to provide an oxide layer over the semiconductor substrate with an opening defining the buried layer region. Polysilicon is then grown over the oxide and buried layer region. Dopant is then diffused through the polysilicon layer to form the buried layer. Once the buried layer is formed the polysilicon is oxidized which at the same time causes some oxidation of the buried layer region. By oxidizing the polysilicon layer it is converted to oxide which is then removed with the first layer of oxide leaving a semiconductor surface having a recessed buried layer region.

Another method practiced in the past was to protect the semiconductor substrate by using a layer of silicon nitride while the buried layer region was being etched. This method required a considerable number of processing steps. First oxide is grown over the substrate, then the oxide is covered with nitride which has to be scrubbed before photoresist can be used. The resist is spun on, exposed, developed, baked, etc. The nitride is then etched through openings provided in a photoresist layer which define the buried layer region. Then the oxide in the buried layer region also has to be etched. When the etching is completed then the photoresist is stripped off. During subsequent processing to form the buried layer, the silicon nitride occasionally would chip or flake off and contaminate the buried layer region in the surface of the semiconductor substrate. This contamination reduced the yield of the devices.

By now it should be appreciated that it would be desirable to provide a process for forming buried layers which simplifies processing of the semiconductor substrate and at the same time does not induce contaminates.

Accordingly, it is an object of the present invention to provide an improved method for obtaining pattern delineation of a buried layer.

Another object of the present invention is to provide a process for obtaining buried layer pattern delineation by simplifying the processing of the semiconductor substrate.

A further object of the present invention is to provide a method for obtaining buried layer pattern delineation in a reduced time cycle while obtaining higher yields.

Yet another further advantage of the present invention is to provide a method for obtaining a recessed enhanced doped area on the surface of a semiconductor substrate.

SUMMARY OF THE INVENTION

The above and other objects and advantages of the present invention are provided by growing oxide on the surface of a semiconductor substrate having a highly doped region defined for buried layer. By maintaining the highly doped region in a metastable state during growing of the oxide, the oxide will grow faster over the highly doped region than it will over the semiconductor substrate surface. The surface of the semiconductor substrate as well as the surface of the highly doped region are both oxidized during the growing of the oxide. However, the surface of the highly doped region oxidizes at a faster rate than does the surface of the semiconductor substrate. Accordingly, when the oxide is removed the highly doped region will be recessed with respect to the semiconductor substrate. This will provide a step in an epitaxial layer which is later grown over the semiconductor substrate. This step provides pattern delineation to define the buried layer region.

The exemplifications set out herein illustrate the preferred embodiments of the invention in one form thereof, and such exemplifications are not to be construed as limiting in any manner.

DETAILED DESCRIPTION OF THE DRAWINGS

The present invention presents a new pattern delineation technique. This technique involves two process steps wherein the first step is implanting of a dopant for selectively doping an area in silicon and the second step is an annealing and oxidation technique of the implanted silicon. The annealing and oxidation technique makes use of the metastable state of the doped silicon. This invention is explained by the use of a P-type substrate having an implanted N-type region to form a buried layer. However, the technique can be practiced on other types of implants and circuits, as an example, the forming of a highly doped region in a depressed area of a surface of a semiconductor substrate, one such example being forming the source and drain areas for a field effect transistor.

Figure 1:
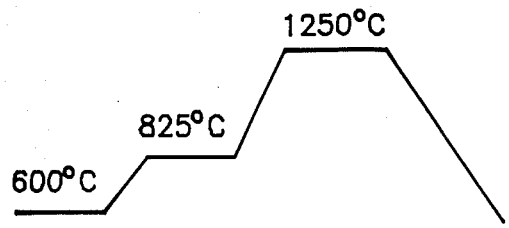
FIG. 1 is a chart illustrating times and temperatures used in performing the present invention.

FIG. 1 illustrates, in chart form, the annealing and oxidation technique of a highly doped region on the surface of a silicon substrate. By way of example, the silicon substrate is (100) oriented crystal, P-type, with 3 to 25 ohms-centimeter resistivity. The highly doped region is implanted with $3 \times 10^{15}$ ions/cm$^2$. A higher dopant level doesn't seem to help much, while a lower level results in higher sheet rho.

FIG. 1 illustrates that the annealing is performed at 600° C. for approximately two hours. The temperature is then increased to approximately 825° C. A typical furnace may take approximately 10 minutes for its temperature to be increased from 600° C. up to 825° C. Steam is used to grow oxide at this temperature level. After growing the oxide with the steam for about two hours the temperature is elevated to approximately 1250° C. for about 80 minutes to diffuse the dopant into the silicon. After the diffusion is completed the temperature is decreased to a level where it is safe to remove the silicon substrate from the furnace.

The oxidation is done at a temperature level which maintains the highly doped area in a metastable state. The highly doped area is said to be in a metastable state since heat changes its state by transferring it to equilibrium. The metastable state of the highly doped area causes oxide to grow faster in this region than it grows on the surface of the silicon substrate. This faster growth rate creates a step between the highly doped region and the silicon surface which results in the highly doped area being in a depression. The metastable state of the highly doped silicon will totally collapse at approximately 1100° C. This means that the highly doped silicon reaches thermal equilibrium thereby collapsing the metastable state. Another way of saying this, is that the metastable state converts or transfers to equilibrium. The temperature at which the oxide is grown is a compromise between the length of time that the silicon substrate is left in the furnace and the desired step difference between the height of the highly doped region and the surface of the silicon substrate. Silicon does not oxidize at an appreciable rate at a temperature less than 700° C., however, the metastable state starts to collapse at approximately 750° C. At about 900° C. a loss of about 35 percent of the metastable state occurs. As the loss of metastable state increases the differential rate of growth of the oxide decreases. Therefore the oxidation temperature is a compromise between the rate of growth of the oxide and the collapse of the metastable state. As the metastable state collapses, the differential oxide growth rate decreases, and therefore more growth time will be required in order to achieve the desired differential in height between the substrate and the highly doped region. The annealing is performed at 600° C. since this is considered a good midrange annealing temperature. The optimum temperature range for growing the oxide is believed to be 815° C. to 835° C. The 1250° C. is selected as a good temperature for driving in of the dopant impurities which is commonly called diffusion. This temperature must be high enough to move or drive in the impurities. After the diffusion the furnace is normally allowed to cool down to its idle temperature which in most cases is the annealing temperature so that the silicon substrates can be removed from the furnace and the next batch of silicon substrates can be inserted into the furnace.

Figure 3:
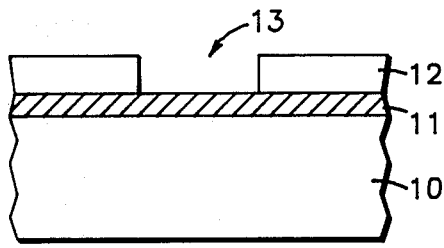
Figure 4:
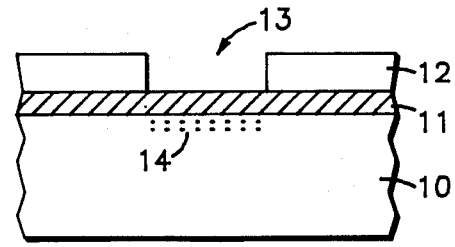
Figure 5:
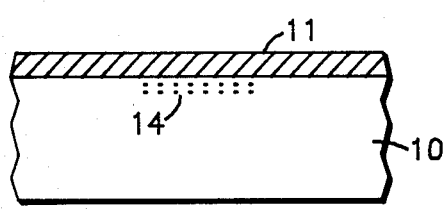
Figure 6:
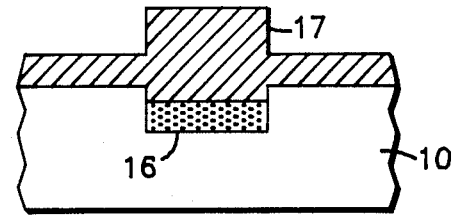

FIGS. 2–8 illustrate a semiconductor substrate 10 in various stages during the manufacturing process. FIG. 6 best illustrates the results of performing the time temperature cycle illustrated in FIG. 1. The device of FIG. 5 is placed in the furnace thereby resulting in the structure of FIG. 6 at the completion of the cycle illustrated in FIG. 1.

Figure 2:
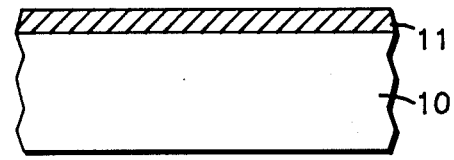
FIGS. 2-8 illustrates a semiconductor substrate in a progression of steps of the present invention.

FIG. 2 illustrates substrate 10 covered by an oxide layer 11 which is commonly called a screen oxide. In a preferred embodiment screen oxide 11 is approximately 20 nm thick.

FIG. 3 shows substrate 10 and oxide layer 11 of FIG. 2 covered with a patterned photoresist layer 12. Photoresist layer 12 is patterned to provide an opening 13.

FIG. 4 is the same as FIG. 3 with the addition of dopant impurity 14 which is illustrated as being close to the surface of silicon substrate 10 next to oxide layer 11. The dopant can be any suitable dopant such as arsenic, antimony, phosphorous, or the like.

FIG. 5 is the same as FIG. 4 with the photoresist layer 12 removed. The structure of FIG. 5 is shown ready to undergo the temperature/time cycle illustrated in FIG. 1.

FIG. 6 illustrates silicon substrate 10 after it has been through the temperature cycle illustrated in FIG. 1. First the damage caused by implanting impurity dopant 14 is annealed, then oxide layer 17 is grown, and dopant impurity 14 is driven deeper into the silicon substrate 10 to provide buried layer 16. Using a dopant concentration of $3 \times 10^{15}$ ions/cm$^2$ to implant dopant impurity 14 and following the temperature time cycles illustrated in FIG. 1 results in approximately a 4 to 1 growth ratio of oxide when the impurity used is antimony. This means that the oxide will grow four times faster over dopant impurity 14 than it will over the surface of silicon substrate 10 which is not doped. If the impurity were arsenic using the same concentration levels and temperature time cycles the oxide would grow at a ratio of 7 to 1. Not only does the oxide grow on the surface of the silicon substrate but it also "grows" into the surface of the silicon substrate. In otherwords, the surface of silicon substrate 10 oxidizes as well as the surface of the region containing dopant impurities 14. This differential oxidation of the surfaces is what creates the step difference in the surface since the surface of the doped region oxidizes at a faster rate. Note that oxide layer 17 is a combination of oxide layer 11 along with newly grown oxide. At this point in the process, in some applications, it may be desirable to perform a field adjust implant, which is not shown in the drawing.

Figure 7:
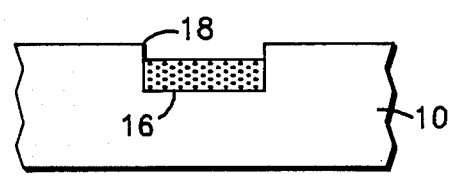

FIG. 7 illustrates the structure of FIG. 6 with oxide layer 17 removed. This leaves buried layer 16 in silicon substrate 10 along with a step 18. Step 18 results from the accelerated growth of oxide over dopant impurity 14 as opposed to the growth of the oxide over the silicon.

Figure 8:
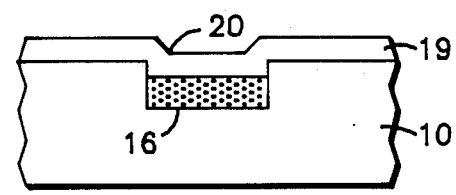

FIG. 8 illustrates the structure of FIG. 7 having an epitaxial layer 19 grown over substrate 10. Since epitaxial layer 19 follows the contour of substrate 10, step 18 from FIG. 7 appears as step 20 in epi layer 19. Step 20 is the pattern delineation which will be used in subsequent processing of substrate 10 for alignment purposes when providing other elements of an integrated circuit in proper relationship to buried layer 16. In this illustrated embodiment, buried layer 16 is typically used as a collector in a bipolar transistor.

By now it should be appreciated that there has been provided a new and improved method for obtaining a step (a depressed region) in the surface of a silicon substrate by making use of the metastable state of the silicon to grow oxide at different rates on the surface of the silicon.

I claim:

1. A method of providing a buried layer having inherent pattern delineation, comprising: adding dopants to a pre-selected area of a substrate; heating the substrate to a predetermined temperature for annealing; growing oxide on the substrate while maintaining the added dopants in a metastable state so that the area containing the added dopants oxidizes faster; increasing the temperature of the substrate to diffuse the added dopants to form the buried layer; removing the oxide to leave the buried layer at a lower level than the surface of the substrate; and growing an epitaxial layer over the substrate thereby burying the buried layer and causing a depression in the epitaxial layer due to the difference in level between the surface of substrate and the buried layer, and wherein the depression provides the pattern delineation.

2. The method of claim 1 wherein the predetermined temperature is approximately 600° C., the growing of oxide is performed at a temperature less than 1100° C., and the doped buried layer is diffused at a temperature of approximately 1250° C.

3. A method of providing buried layer pattern delineation on a semiconductor substrate, comprising: providing an oxide layer on the substrate; patterning a layer of photoresist on the oxide layer and leaving at least one opening in the photoresist for at least one buried layer; doping the substrate through the opening to provide at least one doped area; removing the photoresist; annealing the semiconductor substrate; growing oxide over the substrate; diffusing the doping in the doped area wherein growing the oxide is done at a temperature intermediate the annealing and the diffusing to provide a faster oxide growth rate over the doped area than over the substrate that was not doped; removing the oxide thereby leaving the doped area in a depression; and growing an epitaxial layer over the substrate including the doped area.

4. The method of claim 3 wherein the annealing is performed at a temperature of approximately 600° C., the growing oxide is performed at approximately 825° C., and the diffusing is performed at approximately 1250° C.

5. The method of claim 3 wherein doping of the substrate provides an area of opposite conductivity type to that of the substrate.

* * * * *